(12) United States Patent
Raj et al.

(10) Patent No.: US 8,375,348 B1
(45) Date of Patent: Feb. 12, 2013

(54) METHOD, SYSTEM, AND PROGRAM PRODUCT TO IMPLEMENT COLORED TILES FOR DETAIL ROUTING FOR DOUBLE PATTERN LITHOGRAPHY

(75) Inventors: Satish Samuel Raj, Saratoga, CA (US); Jeffrey Scott Salowe, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 199 days.

(21) Appl. No.: 12/981,062

(22) Filed: Dec. 29, 2010

(51) Int. Cl.
*G06F 17/50* (2006.01)
(52) U.S. Cl. ........... 716/126; 716/55; 716/131; 716/132
(58) Field of Classification Search .................. None
See application file for complete search history.

(56) References Cited

U.S. PATENT DOCUMENTS

| | | | |
|---|---|---|---|
| 7,089,526 B1 * | 8/2006 | Salowe et al. | 716/129 |
| 7,222,322 B1 | 5/2007 | Chyan | |
| 7,594,214 B1 * | 9/2009 | Salowe et al. | 716/119 |
| 7,694,261 B1 * | 4/2010 | Chyan et al. | 716/126 |
| 7,752,590 B1 * | 7/2010 | Chyan et al. | 716/122 |
| 7,934,177 B2 | 4/2011 | Shin | |
| 8,028,253 B2 | 9/2011 | Drapeau | |
| 2001/0038612 A1 | 11/2001 | Vaughn | |
| 2007/0101303 A1 | 5/2007 | Lien | |
| 2008/0244504 A1 | 10/2008 | Drapeau | |
| 2009/0144688 A1 * | 6/2009 | Uchino et al. | 716/12 |
| 2009/0172628 A1 | 7/2009 | Chyan | |
| 2010/0037200 A1 | 2/2010 | Ghan | |
| 2010/0199253 A1 | 8/2010 | Cheng | |
| 2011/0014786 A1 | 1/2011 | Sezginer | |
| 2011/0119648 A1 | 5/2011 | Chen | |
| 2011/0219341 A1 * | 9/2011 | Cao et al. | 716/50 |
| 2011/0296360 A1 * | 12/2011 | Wang et al. | 716/106 |
| 2012/0131528 A1 * | 5/2012 | Chen et al. | 716/112 |

OTHER PUBLICATIONS

Li et al., "NEMO: A New Implicit-Connection Graph-Based Gridless Router With Multilayer Planes and Pseudo Tile Propagation," IEEE Trans. on CAD of ICs & Systems, vol. 26, No. 4 Apr. 2007, pp. 705-718.*
Lin et al., "Double Patterning Lithography Aware Gridless Detailed Routing with Innovative Conflict Graph," DAC'10, Jun. 13-18, 2010, pp. 398-403.*
Hsu et al., "Template-Mask Design Methodology for Double Patterning Technology," 2010 IEEE, pp. 107-111.*
Dion et al., "Contour: A Tile-based Gridless Router," Western Research Laboratory, Mar. 1995, 30 pages.*
Notice of Allowance dated Aug. 21, 2012 for U.S. Appl. No. 12/980,744.
Non-Final Office Action dated Aug. 8, 2012 for U.S. Appl. No. 12/981,431.
Cho et al., "Double Patterning Technology Friendly Detailed Routing", IEEE/ACM International Conference, 2008, pp. 506-511.
Non-Final Office Action for U.S. Appl. No. 12/980,744 mailed on May 11, 2012.

* cited by examiner

*Primary Examiner* — Leigh Garbowski
(74) *Attorney, Agent, or Firm* — Vista IP Law Group, LLP

(57) ABSTRACT

Disclosed are a method, apparatus, and computer program product to implement routing for double patterning lithography using colored space tiles. A three-phase routing scheme is employed, comprising a global router, a C-router, and a detail router. The C-router provides double patterning color seeding for routing tracks in the electronic design. The detail router employs space-tiles to perform double-patterning based routing for wires in the electronic design. Colored space tiles may be utilized to perform the detail routing.

24 Claims, 18 Drawing Sheets

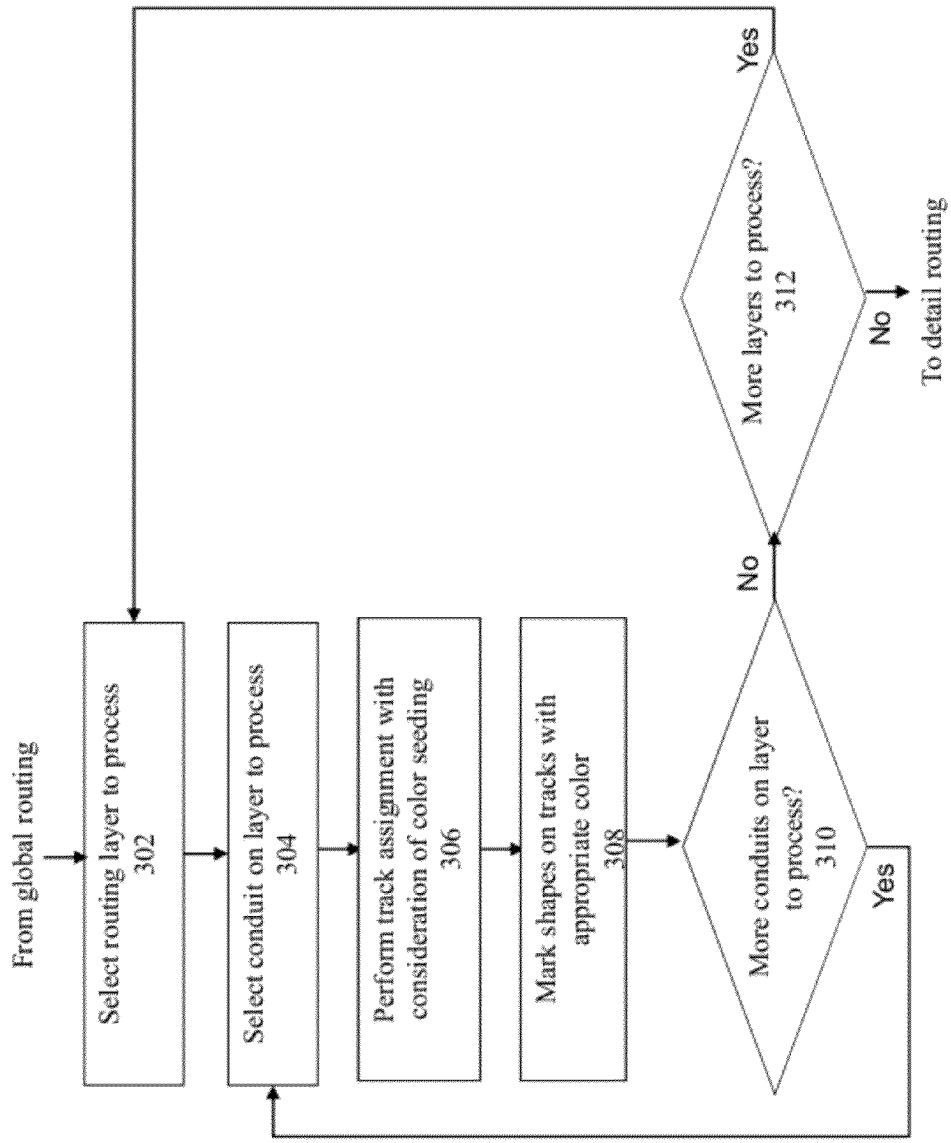

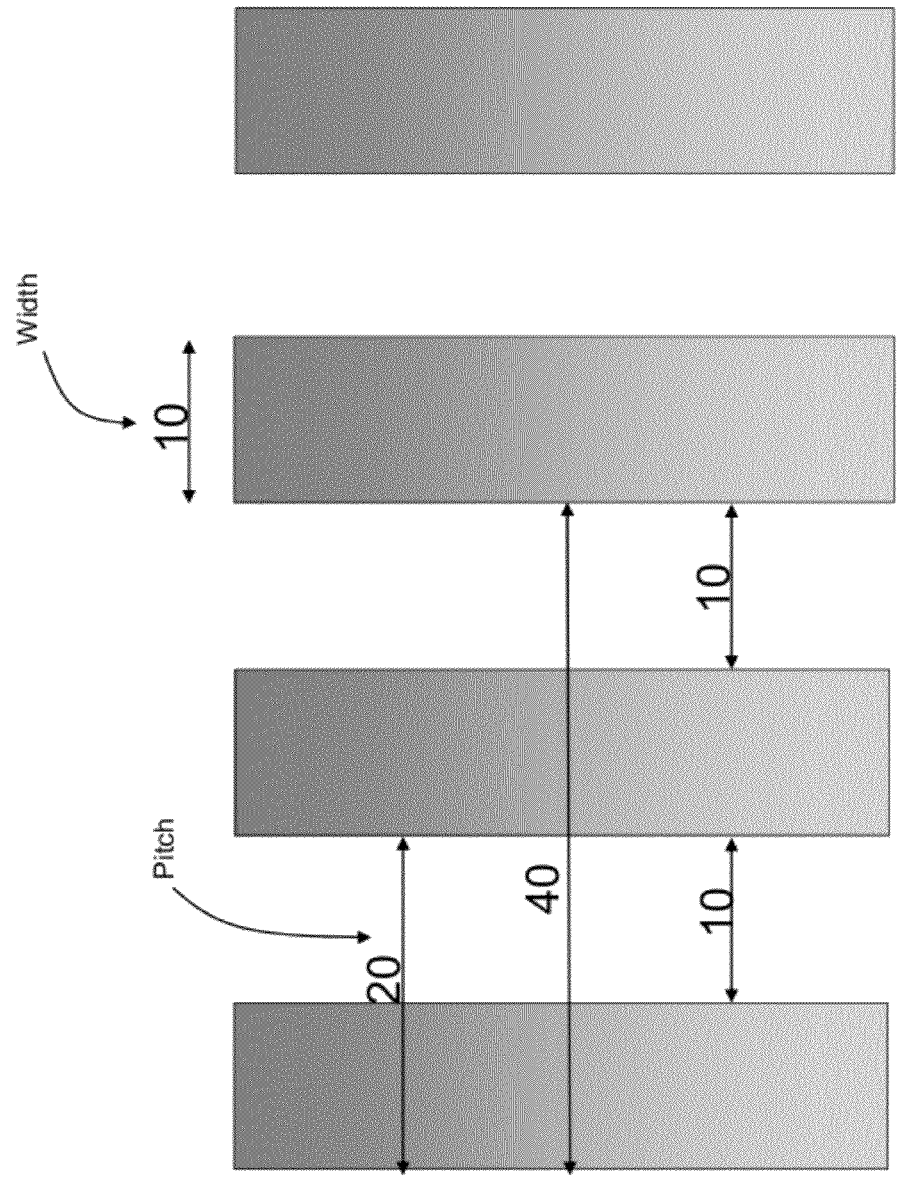

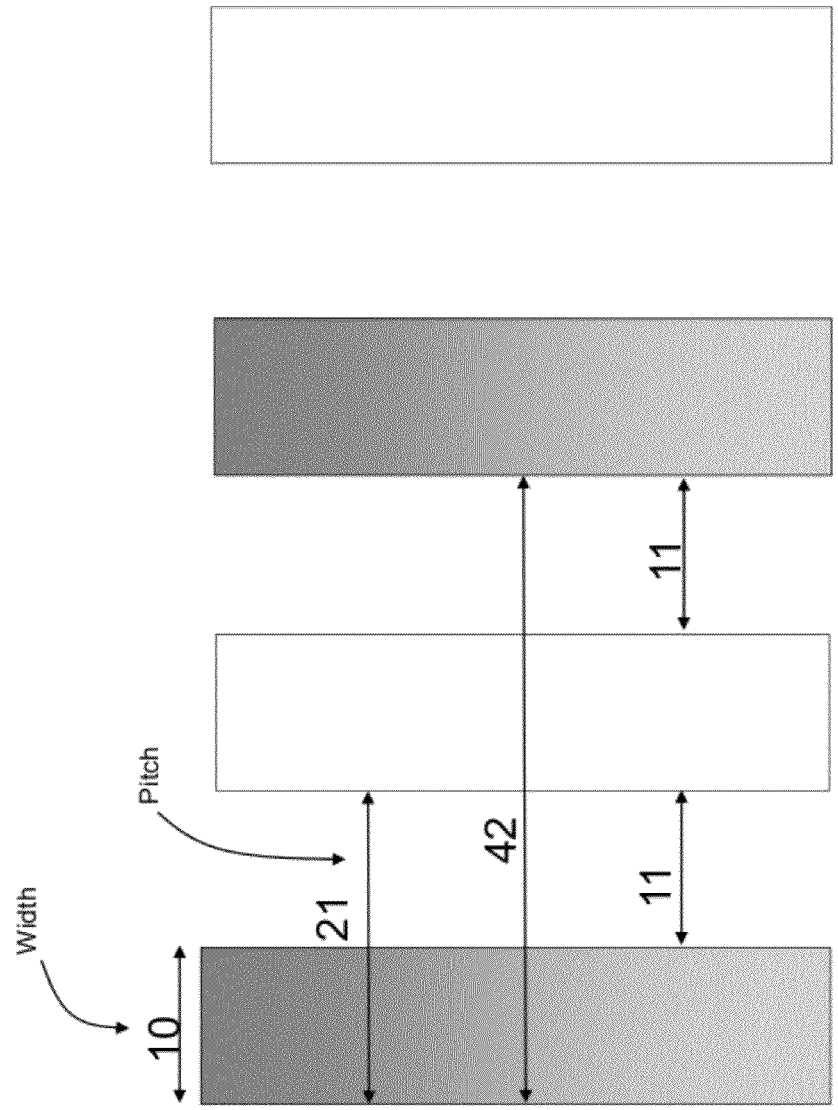

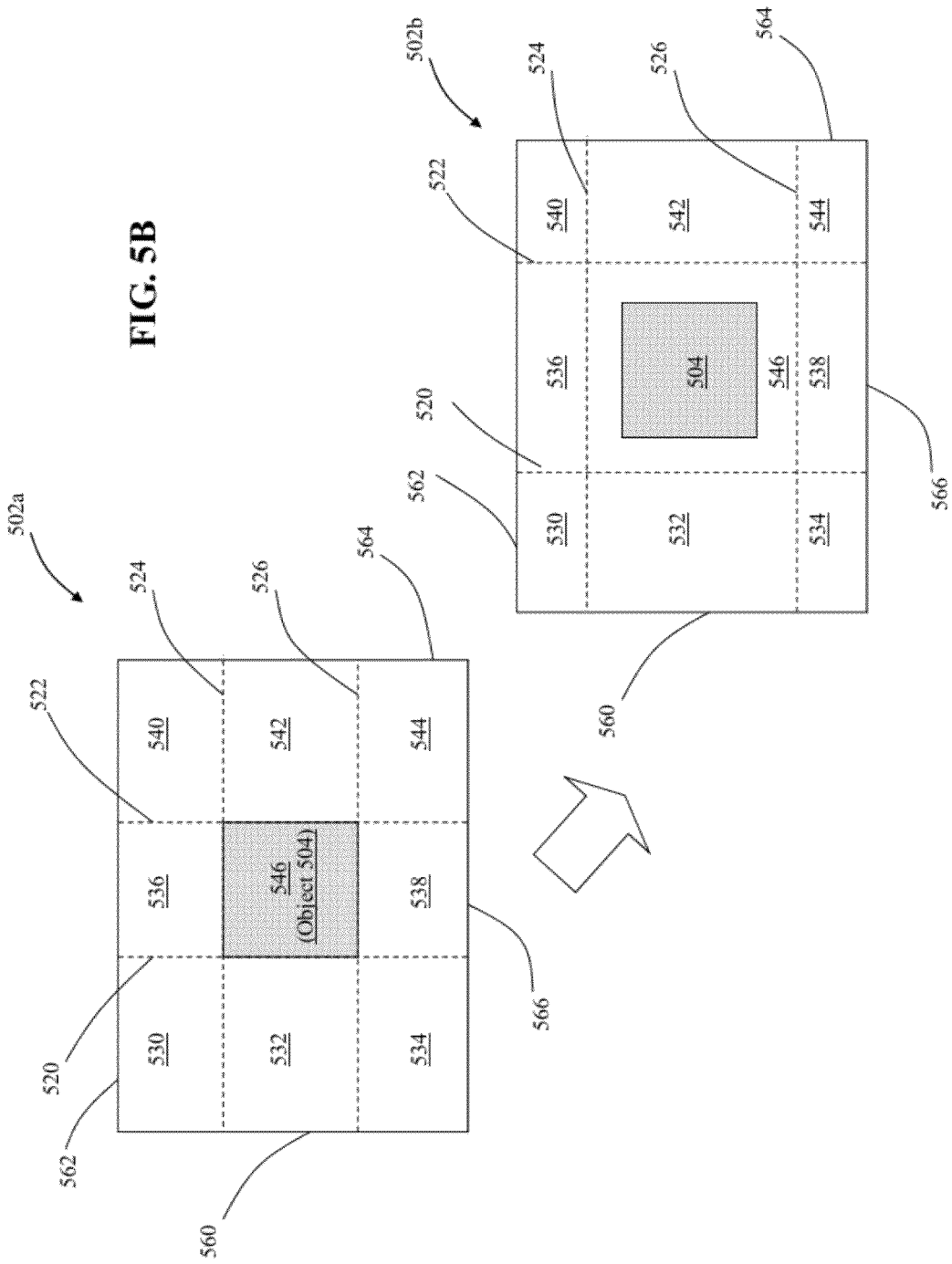

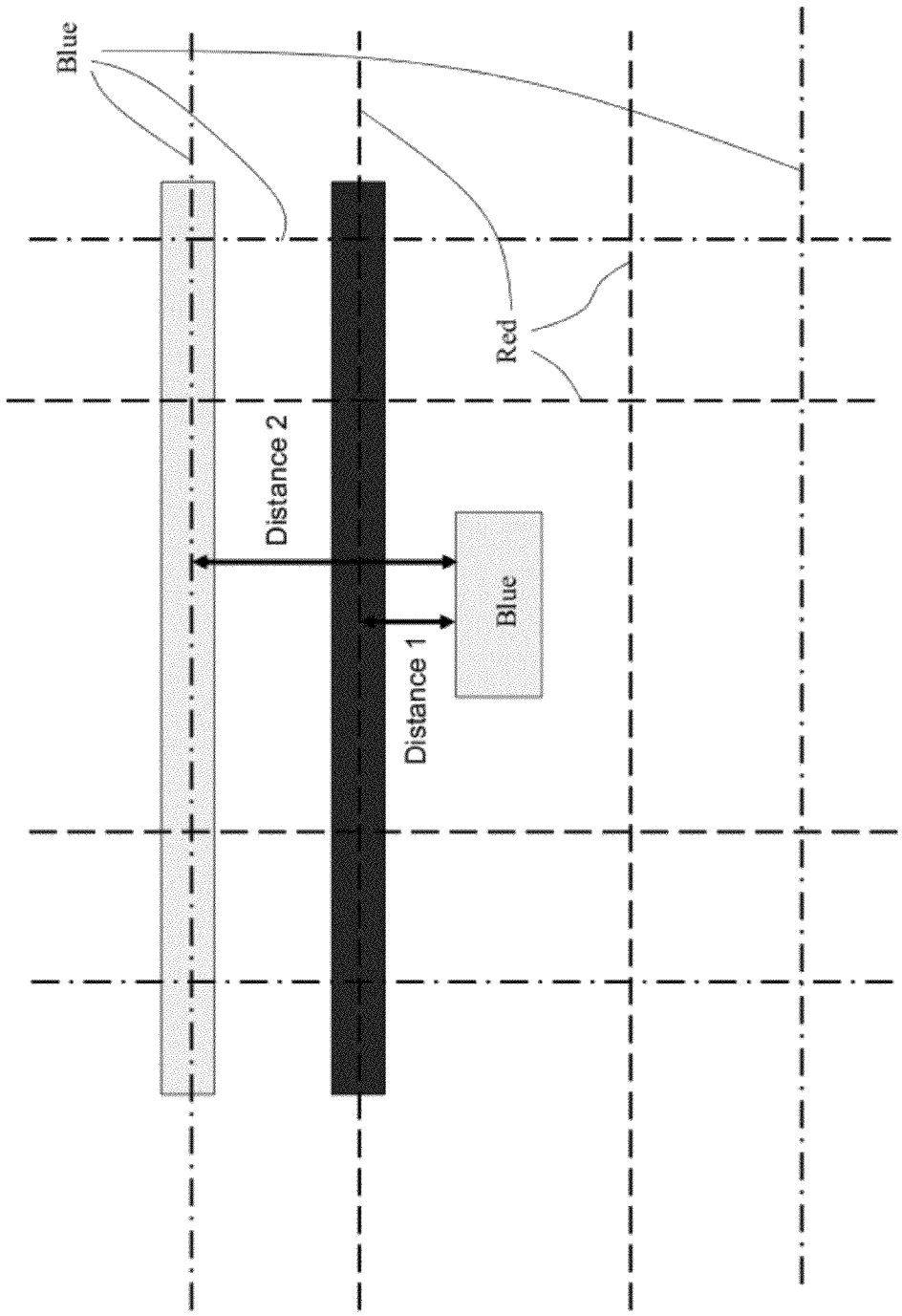

FIG. 8A
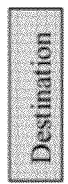
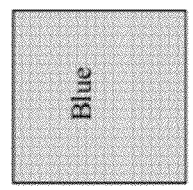
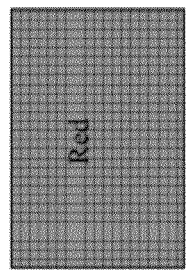
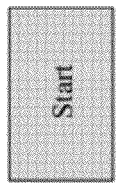
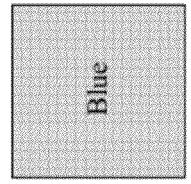

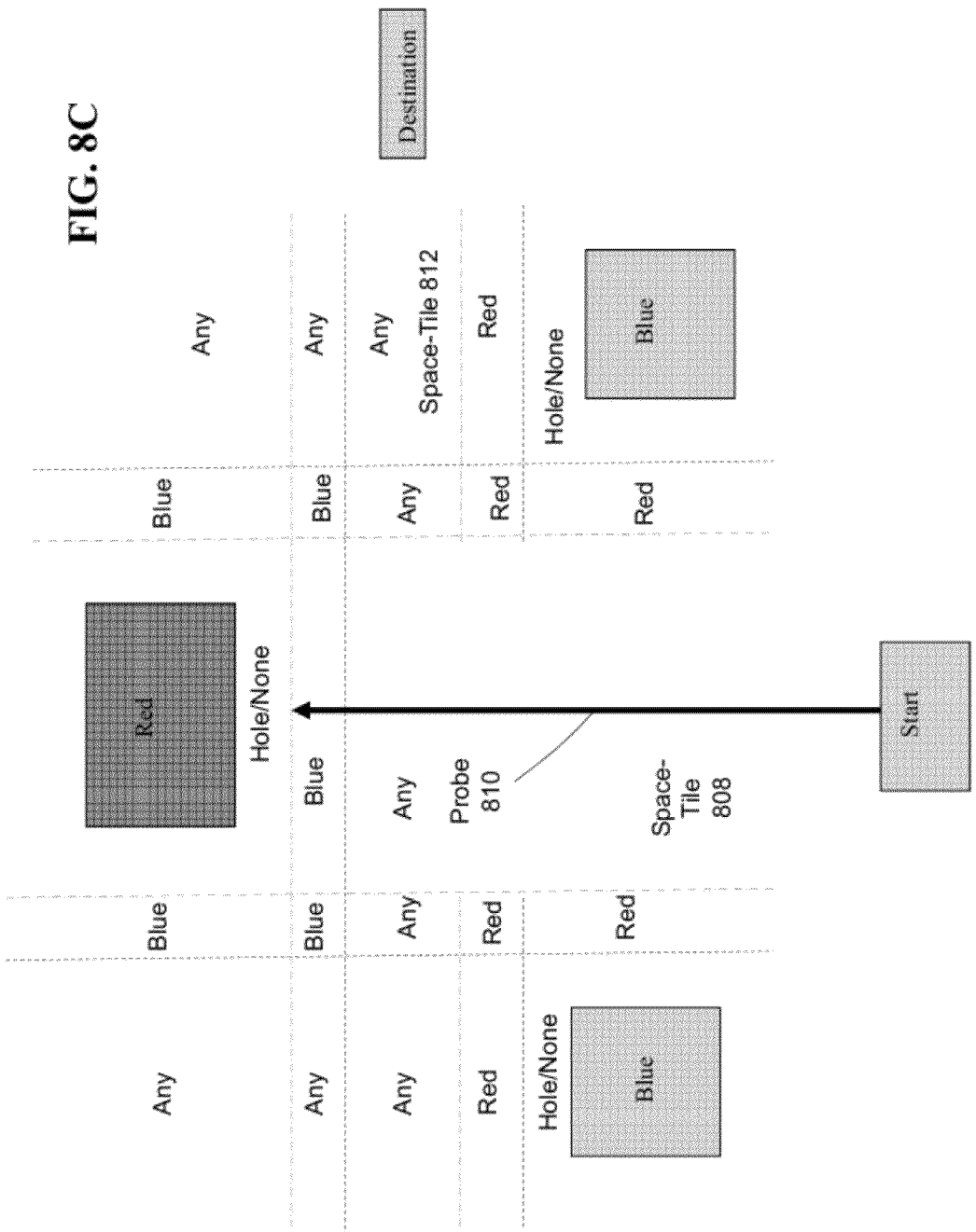

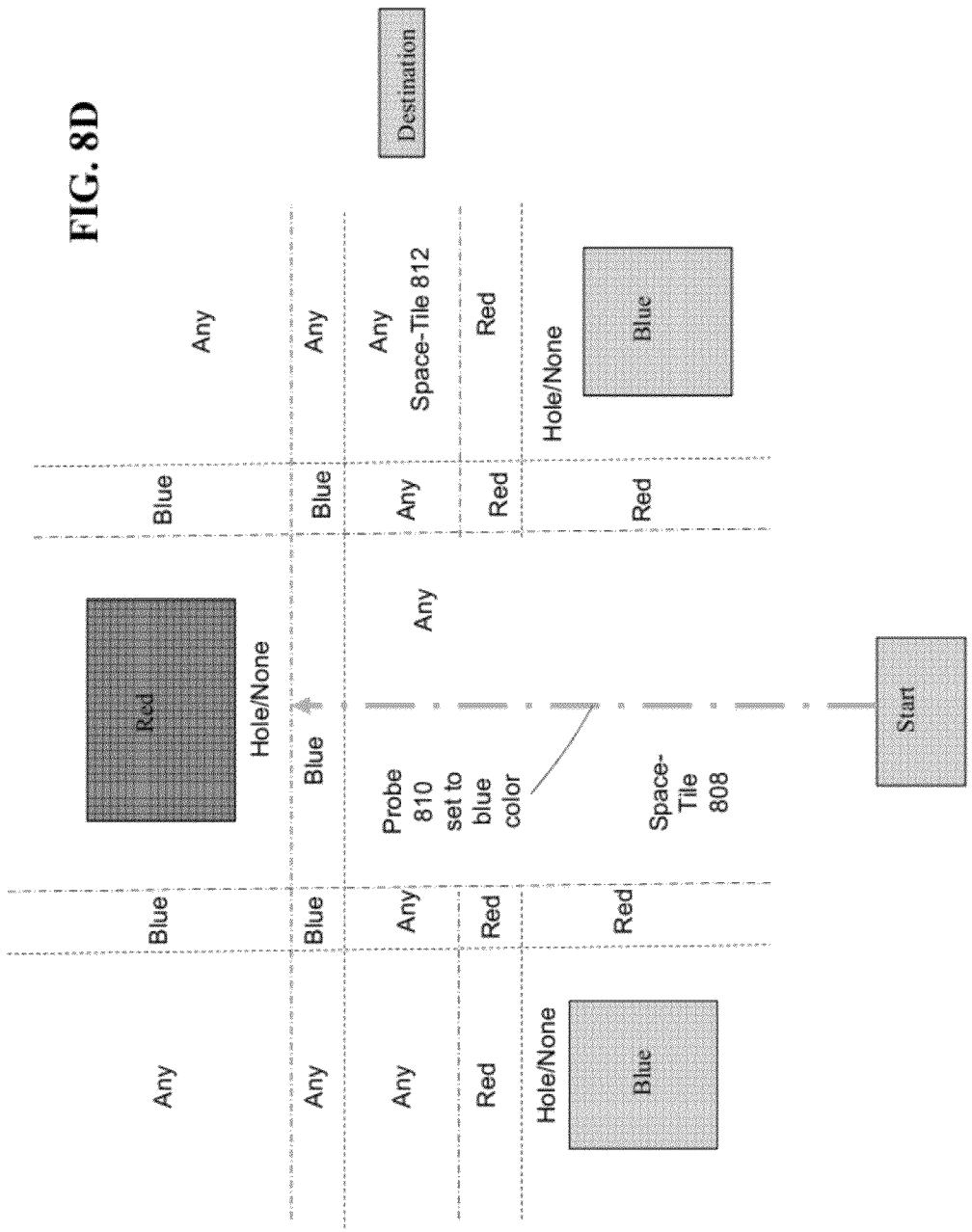

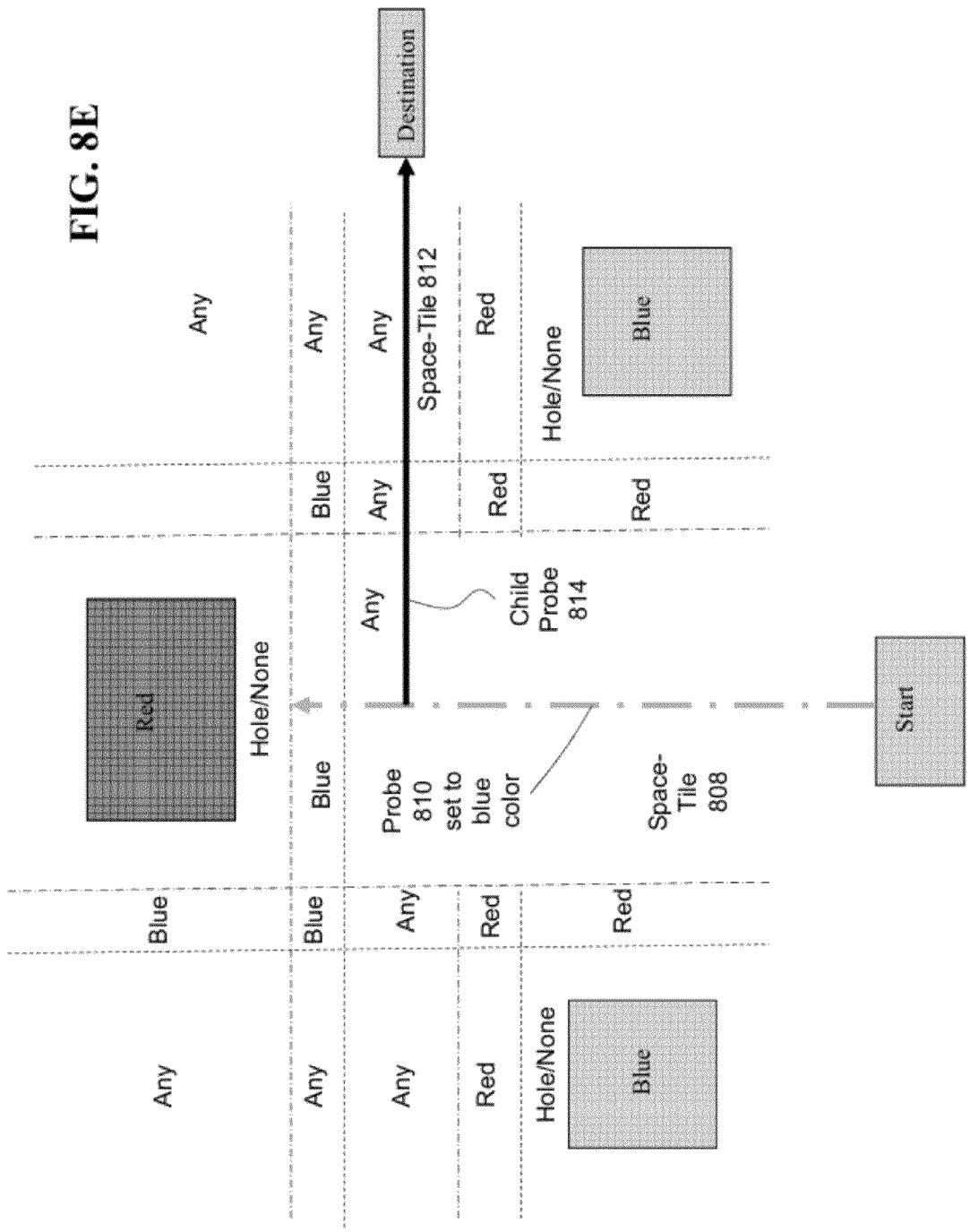

METHOD, SYSTEM, AND PROGRAM PRODUCT TO IMPLEMENT COLORED TILES FOR DETAIL ROUTING FOR DOUBLE PATTERN LITHOGRAPHY

CROSS-REFERENCE TO RELATED APPLICATIONS

This application is related to U.S. application Ser. No. 12/980,744, entitled "METHOD, SYSTEM, AND PROGRAM PRODUCT TO IMPLEMENT DETAIL ROUTING FOR DOUBLE PATTERN LITHOGRAPHY" and U.S. application Ser. No. 12/981,431, entitled "METHOD, SYSTEM, AND PROGRAM PRODUCT TO IMPLEMENT C-ROUTING FOR DOUBLE PATTERN LITHOGRAPHY", both filed on even date herewith, and both are hereby incorporated by reference in their entirety as if fully set forth herein.

FIELD

This invention concerns electronic design automation to implement routing of electronic designs with regard to double pattern lithography.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. The layout data set is stored, for example in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process.

One or more photomasks are created from the layout file for the photolithography of each layer. Photomasks are used to transfer the layout pattern onto the physical layer on the wafer. A photomask, or mask, provides an image of the desired physical geometries of the respective integrated circuit layer. Passing light through the mask projects the layout pattern for the layer onto the wafer. An imaging lens system projects and focuses the layout onto the substrate. The projected light pattern interacts with a photosensitive resist coating on the wafer and, resist portions that are exposed to light are rendered either soluble or insoluble in a developer solution, depending on the type of the photoresist. Accordingly, the mask pattern is transferred into the photo-resist by optical projection and chemical reactions. The photo-resist pattern is subsequently transferred to an underlying layer by an etch process. Most commonly, plasma containing chemically-selective reactive ions is used to etch high-aspect ratio trenches and holes with close to vertical sidewalls.

With a continuing desire to provide greater functionality in smaller packages and the evolution of system-on-chip and mixed-signal designs, IC feature geometries are being driven to smaller and smaller dimensions. However, the ability to project an accurate image of increasingly smaller features onto the wafer is limited by the wavelength of the light used, and the ability of the lens system. For deep sub-micron semiconductor manufacturing process, such as processes at feature sizes of 22 nm and below, the layout geometries on a single layer normally cannot be printed on silicon with a single lithography mask except with great difficulty and/or manufacturing defects/problems. To address this problem, the combination of two masks can be used to create the geometries for a single layer. This approach is often referred to as "double pattern" or "double patterning" technology.

While this new technology theoretically may be used to manufacture semiconductor devices, EDA tools do not yet exist which can efficiently implement routing for double patterning designs that are correct-by-construction. Instead current approaches require post-route layout decomposition and re-routing to fix conflicts. The problem with this type of approach is that it can result in a large number of errors during layout decomposition, which could be impossible to fix, or if even fixable, would require an excessive amount of time and/or resource cost to find a solution.

Therefore, there is a need for an improved approach to implement efficient routing for double-patterning lithography.

SUMMARY

Embodiments of the present invention provide an improved method, apparatus, and program product to implement routing for double patterning lithography. A three-phase routing scheme is employed, comprising a global router, a C-router, and a detail router. In some embodiments, the detail router follows the C-router, and employs space-tiles to perform double-patterning based routing for wires in the electronic design. Colored space tiles may be utilized to perform the detail routing in some embodiments of the invention.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The drawings illustrate the design and utility of embodiments of the present invention, in which similar elements are referred to by common reference numerals. In order to better appreciate the advantages and objects of embodiments of the invention, reference should be made to the accompanying drawings. However, the drawings depict only certain embodiments of the invention, and should not be taken as limiting the scope of the invention.

FIG. 3 illustrates a flowchart of an example approach to implement C-routing for double pattern lithography.

FIGS. 4A and 4B illustrate different results for performing track assignment by a C-router.

FIGS. 5A-C illustrate space tiles in an electronic design.

FIG. 6B illustrates space tiles that correspond to multiple colors for performing double-pattern lithography.

FIGS. 8A-F illustrate an example of the search strategy of FIG. 7.

DETAILED DESCRIPTION OF THE EMBODIMENTS OF THE INVENTION

Figure 1:
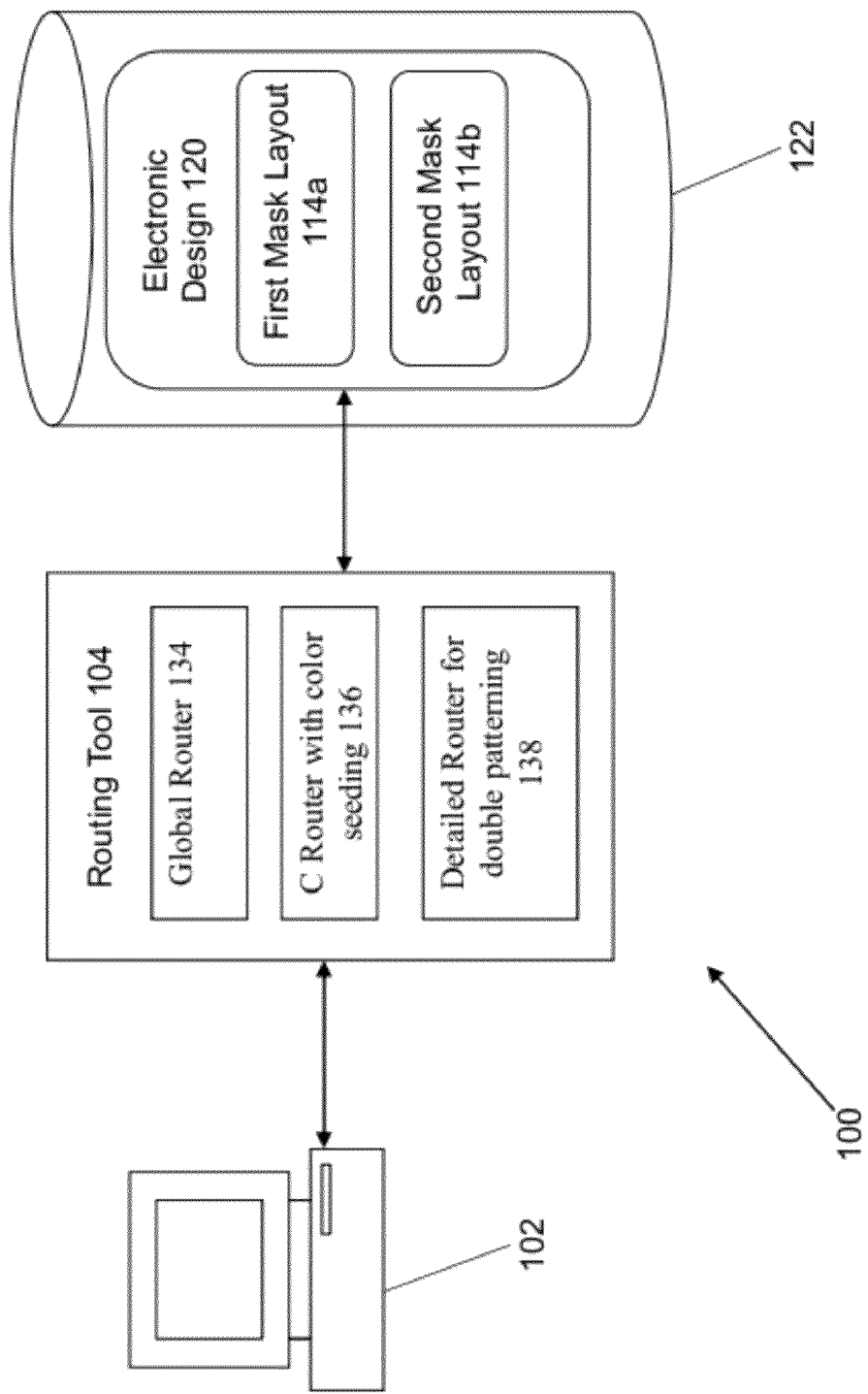
FIG. 1 illustrates an example system to implement routing for double pattern lithography.

Embodiments of the present invention provide an improved method, apparatus, and program product to implement routing for double patterning lithography. A three-phase routing scheme is employed, comprising a global router, a C-router, and a detail router. In some embodiments, the C-router provides double patterning color seeding for routing tracks in the electronic design. The detail router employs space-tiles to perform double-patterning based routing for wires in the electronic design.

To explain the problem being addressed by embodiments of the invention, consider that the minimum feature size that a projection system can print can be expressed by:

$$CD = k_1 \frac{\lambda}{NA}$$

where CD, critical dimension, is the minimum feature size; $k_1$ is a dimensionless coefficient of process-related factors; $\lambda$ is the wavelength of light used; and NA is the numerical aperture of the projection lens as seen from the wafer. The equation above is not a black-and-white absolute limit. The yield of the lithographic process gradually decreases, and its cost increases, as $k_1$ decreases below 0.35. Reducing $k_1$ below 0.28 for a single exposure is not practical. There is a fundamental, hard limit for the pitch of a periodic pattern:

$$\text{Period} \geq 0.5 \frac{\lambda}{NA}$$

The pitch limit cannot be violated, irrespective of the photomask and resolution enhancement technologies that may be used, when using a resist employing a single-photon reaction. The reason for this limitation is that the optical intensity image produced inside the photo-resist is band-limited in the spatial-angular-frequency domain. When the intensity image is Fourier transformed with respect to the x and y coordinates (coordinates in the plane of the wafer), the support of the transformed intensity image is contained in a disk of radius $4\pi NA/\lambda$. Patterns that can be printed by a single lithography step are approximately level curves of such band-limited functions.

To address this problem, double patterning is used to print the pattern using multiple masks with sequential lithography steps. A first mask is used to lithographically create a first pattern, where the shapes in the first pattern are spaced far enough apart such that they can be printed with a single mask. A second mask is than used to lithographically create a second pattern, where again the shapes in the second pattern are spaced far enough apart to be printed with the second mask. The combination of using the first mask to create the first pattern and then using the second mask to create the second pattern allows the final product to have a pattern that otherwise cannot be printed using a single mask.

The present invention provides an improved approach to implement double pattern lithography for routing structures on an electronic design. The present approach can be employed with any routing system, whether gridded or gridless.

In general, embodiments of the invention perform routing using a three-level routing scheme that is performed in consideration of double patterning. The three-level routing scheme initially performs global routing to provide a general design of the planning topology for routes in the design. Global routing is followed by C-routing (which refers to either "corridor-routing" or "conduit-routing") to perform and coordinate assignments for routes which cross one or more global cell boundaries defined during the global routing stage. Thus, C-routing will determine the major part or trunk of a route which cross multiple global cells. In some embodiments of the invention, C-routing is performed to provide partial/incremental color seeding for double patterning lithography. The color seeding during C-routing may be "partial" or "incremental" in the sense that pre-existing blockages from earlier-stage design/layout activities may have already been colored prior to routing, and therefore the C-routing action provides color seeding for the shapes to be implemented during the current routing stage.

Detail routing is performed after C-routing, and is performed to handle mostly short connection within a global cell. According to some embodiments, the detail routing is performed using a shape-based approach to identify appropriate colored routing paths. The three-level routing technique provides a very effective "divide and conquer" approach for routing that allows each of the three levels of routers to effectively handle a manageable portion of the hierarchy of routing tasks.

FIG. 1 illustrates an example system 100 which may be employed in some embodiments of the invention to perform routing for double patterning lithography. System 100 may include one or more users at one or more user station(s) 102 that operate the system 100 to design or edit electronic designs 120. Such users include, for example, design engineers or verification engineers. User station 102 comprises any type of computing station that may be used to operate, interface with, or implement EDA applications or devices, such as routing tool 104. Examples of such user stations 102 include for example, workstations, personal computers, or remote computing terminals. User station 102 comprises a display device, such as a display monitor, for displaying electronic design layouts and processing results to users at the user station 102. User station 102 also comprises one or more input devices for the user to provide operational control over the activities of system 100, such as a mouse or keyboard to manipulate a pointing object in a graphical user interface.

The electronic design 120 comprising a layout to be implemented with double patterning technology, where the electronic design 120 may be stored in a computer readable storage device 122. The layout may correspond to a first mask layout 114a and a second mask layout 114b. Computer readable storage device 122 comprises any combination of hardware and software that allows for ready access to the data that is located at the computer readable storage device 122. For example, computer readable storage device 122 could be implemented as computer memory operatively managed by an operating system. The computer readable storage device 122 could also be implemented as an electronic database system having storage on persistent and/or non-persistent storage.

One or more EDA tools, such as routing tool 104, may be used by users at a user station 102 to route electronic design 120 and to generate patterns for the first and second mask layouts 114a and 114b. According to some embodiments of the invention, the routing tool 104 comprises a global router 134, a C-router 136, and a detail router 138. Any suitable approach may be employed to implement global router 134 to provide a high-level approximation of routes for nets within the electronic design 120.

As described in more detail below, the C-router 136 provides color-based seeding of assignments for tracks between and across the boundaries of global cells within the design 120, and can also be used to implement relatively long segments within the design. Detail router 138 performs the detailed placement of shapes within the layout, where the shapes correspond to the routing structures. According to some embodiments, the detail router 138 performs "spaced-based" routing to establish color-correct routing paths for an electronic design.

Figure 2:
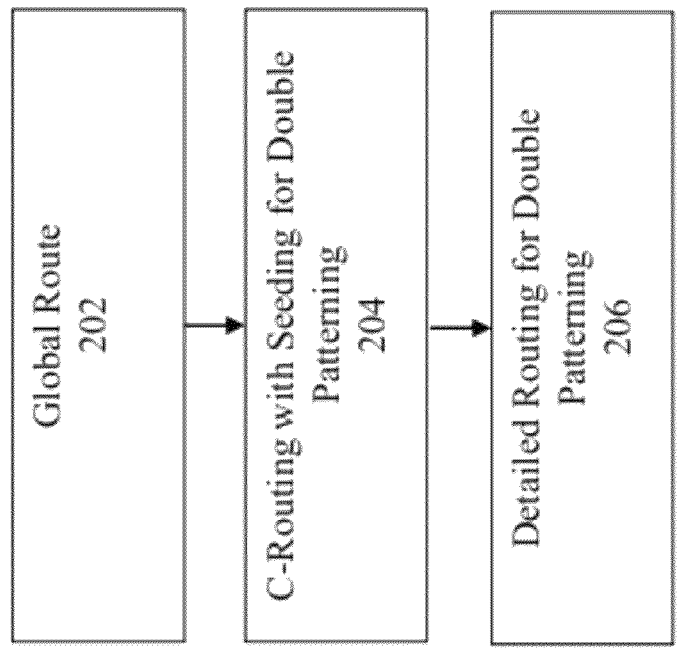
FIG. 2 illustrates a high level flowchart of an example approach to implement routing for double pattern lithography.

FIG. 2 shows a high level flowchart of an embodiment of the invention. At 202, global routing is performed. As discussed above, global routing is performed to provide a high-level approximation of routes for nets within the electronic design.

Next, at 204, C-routing is performed to provide a color seeding for double pattern lithography. As previously noted, the C-routing may be performing partial color seeding to provide color seeding for the shapes to be implemented during the current routing stage, where pre-existing blockages from earlier-stage design/layout activities may have already been colored prior to routing. The present approach incorporates double-pattern layout decomposition during conduit routing before the search-based detail routing step in the routing flow. The C-routing action is a conduit-routing step which takes a global-routed layout and assigns tracks for the long global-routed wires and implements them as detail wires. The idea is to use the partially implemented routing to seed the coloring for the detail routing step. This coloring can be done after assigning tracks prior to implementing the detail wires. The approach uses the exact spacing requirements between objects of the same or different color and so can adapt efficiently to both a gridded or gridless routing space.

At 206, detail routing is performed. The embodiments of the invention use "space-tile" marking to aid in the determination of a routing path for a particular color, as described in more detail below. The approach is a space-based technique, and is not based on tracks, which provides advantages, e.g., to implement routing with double-cut vias. The approach will also work correctly for wires on the pin layer. This detail routing approach for double patterning is a correct-by-construction technique, so though it may fail to route, it will not continue to restore infeasible configurations.

FIG. 3 shows a detailed flowchart of an approach for implementing the C-router according to some embodiments of the invention. The general idea is that at the track assignment stage of routing, the C-router will start coloring the shapes so that at the completion of the C-routing stage, color seeding will have been performed for routing-related shapes in the appropriate colors. The color seeding can then be used by the detail router to implement the correct-by-construction detail routes for the electronic design.

At 302, the C-router selects a routing layer to process, and at 304, the C-router will select a conduit on that layer for routing. When processing each conduit on a particular routing layer at 306, track assignments will be performed with consideration of the appropriate color seedings for the tracks. Assume that the first mask double patterning corresponds to a first color (e.g., blue) and that the second mask corresponds to a second color (e.g., red). The global routes in a conduit are assigned to tracks with consideration of the appropriate spacings for the different color combinations of the track shapes. For example, the tracks would be assigned with consideration of Red-Blue, Blue-Red, Red-Red, and Blue-Blue spacings.

In general, the spacing requirements are generally implemented as manufacturing rules from a given fabrication or manufacturing facility, and are often enforced by design rule checking or "DRC." The Red-Blue and Blue-Red spacings correspond to adjacent shapes that are printed with different masks. The Red-Red and Blue-Blue spacings correspond to shapes that are printed with the same masks. Therefore, the rules for Red-Blue and Blue-Red spacings are the typical DRC spacing rules that would be required for any two shapes on a mask to ensure compliance with proper manufacturing tolerances. The Red-Red and Blue-Blue spacing rules correspond to the single-mask pitch requirements for manufacturing. In general the Red-Red/Blue-Blues spacing rules have larger required distances as compared to the Red-Blue/Blue-Red spacing rules.

Other types of considerations may also be factored into the spacing analysis. For example, width-dependent rules may also be considered when determining the spacings for the track assignments.

One approach that can be taken to perform C-routing track assignments with consideration of spacing rules is described in co-pending U.S. application Ser. No. 11/964,639, filed on Dec. 26, 2007, entitled "METHOD AND SYSTEM FOR UTILIZING HARD AND PREFERRED RULES FOR C-ROUTING OF ELECTRONIC DESIGNS," which is hereby incorporated by reference in its entirety.

At 308, the shapes assigned to tracks are marked with the appropriate colors. This coloring provides the color seedings that will be used by the detail router, as described in more detail below. If there are more conduits on the layer, then at 310, the process returns back to 304 to process the additional conduit(s).

If all conduits on the layer have been processed, then a determination is made at 312 whether there are additional layers to process. If so, then the process returns back to 302 to select the next layer for C-routing. This process continues until all layers and conduits have been processed.

One advantage of embodiments of the present invention is that the track assignment spacings can be implemented to match any required distances, and is not dependent and/or constrained by grid-based distance requirements. This allows the tracks to be assigned with spacing distances that are specific to the current routing and process requirements, instead of being locked into a fixed grid having grid parameters that may or may not match the required spacing parameters.

To explain, consider again an electronic design in which 'Red' and 'Blue' are used as the two colors to differentiate shapes for the two lithography masks for double patterning. Assume that the width of wires on a particular layer is 10 units, spacing between the tracks is 10 units. The pitch (wire width+wire spacing) would be 20 units. FIG. 4A illustrates track assignments using a grid-based approach that provides grid points of different colors, where the search algorithm is modified to encourage 2-coloring compliance. This figure shows the situation if the grid-spacings exactly match the spacing/pitch requirements for the R wire assignments. However, consider if the spacing/pitch do not match the grid-spacings, e.g., if the pitch requirements exceed 20 units. In this situation, the only way to accommodate the required spacings is to expand over multiple additional grid points. In addition, there is a problem using the marking grids correctly when implementing over-sized or double-cut vias, which could also require the track assignments to span over multiple grid points. Therefore, the grid-based approach may result in track assignments that are highly inefficient and wasteful of space.

Using certain embodiments of the invention, the tracks can be assigned with spacing distances that are specific to the needed routing requirements. For example, assume that the pitch of R-R and B-B wires is 42. Track assignment with the fixed grid would inefficiently place the wires at a uniform pitch of 20. However, with double patterning using embodiments of the invention, the long conduit wires could be spaced exactly 11 units apart and marked as 'Red' and 'Blue' appropriately, thus satisfying the R-R/B-B pitch requirement as illustrated in FIG. 4B. This type of track assignment can be performed for all conduits on all layers. The result is a set of track assignments having color seeded shapes which can be configured to exactly match the pitch requirements, which form a starting point for the detail router.

Therefore, the present approach alleviates the expensive and time-consuming step of layout decomposition as a conduit-routed view generally has far fewer and longer routing shapes. It also allows for partial coloring of pins which are aligned with the assigned and colored tracks, and reduces the problem space for a search-based double-pattern detail routing solution and thereby should improve its performance. Moreover, the embodiment of the invention does not rely on a pre-existing routing grid. Another possible approach is to use a net-based approach to assign colors to nets. However, the present invention provides significant advantages over this net-based color approach, since the net-based color approach makes it much more difficult to route on the pin layers and could cause local congestion of one color in order to maintain a consistent net color.

As is clear from the above discussion, embodiments of the invention can be advantageously used in a gridless environment. However, embodiments can also be used in gridded environments to improve the routing process. For example, in the gridded approach, the above-described approach would be modified to perform C-routing in alignment to one or more grids, and the detail routing would use gridded paths for the detailed routes.

This document will now describe an approach for implementing a detail router according to some embodiments of the invention. The key inventive steps are to first use "space-tiles" to mark regions where a red wire is allowed to go, a blue wire is allowed to go, or either a red or a blue wire is allowed to go. Space-tiles are described in more detail below, but generally refer to a region of space that is based upon shapes in the design, and which define allowable areas for introducing routing paths. The next step is to only define the color of a "probe" or its descendents when it passes through a red-only or blue-only area, where the probe refers to a sub-division of a space-tile. Previous space-based routing solutions never considered wire color, so this is a new, non-trivial, consideration. Gridded routing solutions use grid-points, not space-tiles. Some coloring solutions use net-based coloring; other solutions use track-based coloring. This solution is correct-by-construction, and does not assume a priori that a connection is a particular color. Searching for red or blue paths can occur simultaneously. This invention offers the first gridless, shape-based approach to deal with the double-patterning problem.

It is noted that there are other possible approaches to implement detail routing for double pattern lithography. For example, one possible approach is to mark the tracks with different colors (e.g., red and blue) so that neighboring tracks use different colors. The problem with this approach is that it will not function correctly if there are double-cut vias, since double-cut vias take two tracks on one of the layers which breaks the assumption that neighboring tracks use different colors. Also, this approach will not be correct for a shape-based router that does not use pre-defined routing tracks. Another possible approach is to assign a different color to each net. This approach makes it difficult to add routing to the pin layer, assuming that the pins are already colored. It is also possible that a region may become locally congested with a single color if net color consistency is maintained. Yet another possible approach is to ignore these rules while routing and then attempt to correct areas where coloring problems occur. However, the drawback is that if coloring is performed with post-processing, then the initial configuration may contain a color cycle, meaning that the shapes cannot be colored to obey the double-patterning rule. If the router does not understand the coloring, then there is no guarantee of convergence in the re-routing step.

Therefore, the current embodiment that implements shape-based routing with space-tiles provides advantageous routing results over these alternate approaches. The general idea is that space-tile marking are used to aid in the determination of a routing path for a particular color. Since the invention is a space-based technique, and is not based on tracks, the invention will properly work with double-cut vias, and will also function correctly for wires on the pin layer (since the probes will inherit the color of the pin). The invention provides a correct-by-construction technique, so although it may fail to route, it will not continue to restore infeasible configurations.

A set of space tiles is formed by tessellating an area within an IC design. A space tile corresponds to a plane figure in the tessellation. In one embodiment, the contours of some or all of the space tiles are derived from or are based upon the shapes of existing objects in the tessellated area. "Free" space tiles refer to space tiles which are presently unoccupied. "Used" space tiles refer to space tiles that are occupied by one or more objects. An exemplary approach for implementing space tiles is described in U.S. Pat. No. 7,222,322, issued on May 22, 2007, entitled "METHOD AND MECHANISM FOR IMPLEMENTING TESSELLATION-BASED ROUTING", which is hereby incorporated by reference in its entirety.

Figure 5A:
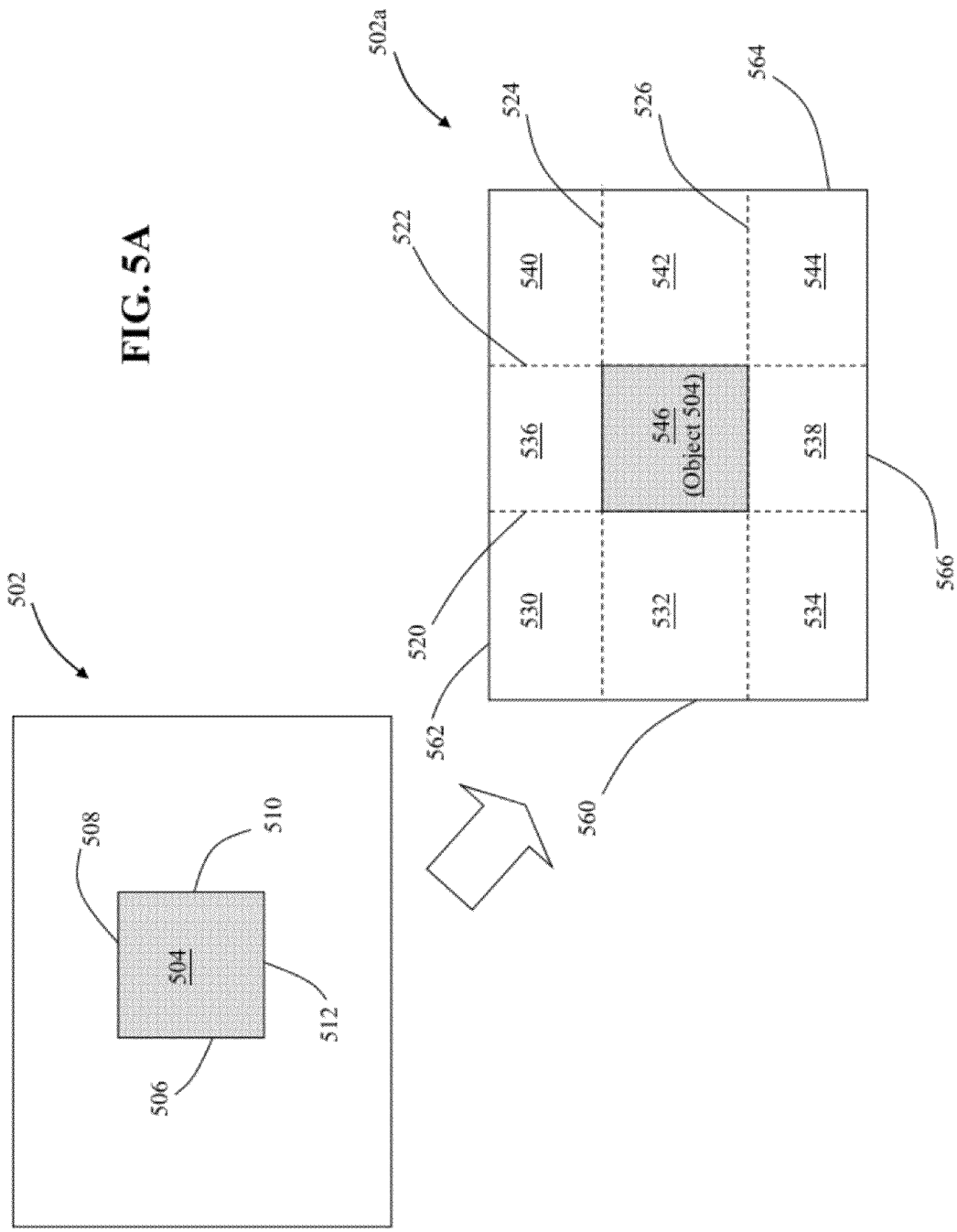

Various approaches can be employed to form space tiles on a chip. One example approach is to identify the edges of existing objects within a window, and extending those edges (e.g., using hyper-planes) to define boundary lines within the window. These boundary lines become the borders of spaces tiles within the window. FIG. 5A illustrates this approach for forming space tiles using the boundaries of existing shapes within a chip portion. In FIG. 5A, an existing shape/object 504 is located in a window 502. Object 504 is shaped such that it includes a top edge 508, bottom edge 512, left edge 506, and right edge 510. As shown in revised window 502a, each of the edges 506, 508, 510, and 512 on object 504 are extended in both directions until they reach the edge/boundary of the window 502a or another object. These edge extensions form boundary lines in the window 502a. Thus, edge 506 is extended to form boundary line 520. Similarly, edge 508 is extended to form boundary line 524, edge 510 is extended to form boundary line 522, and edge 512 is extended to form boundary line 526. If window 502a contains additional shaped objects, this process repeats for each additional object in the window.

A space tile corresponds to each portion of window 502a bounded by a set of boundary lines, or bounded by boundary lines and the edge of the window 502a. Thus, space tile 530 corresponds to the portion of window 502a bounded by boundary line 520, boundary line 524, left window edge 560, and top window edge 562. Space tile 532 corresponds to the portion of window 502a bounded by boundary line 524, boundary line 520, boundary line 526, and left window edge 560. In a similar manner, space tiles 534, 536, 538, 540, 542, and 544 correspond to the various boundary lines and window edges shown for window 502a. Note that each of these space tiles 530-544 are vacant of any shapes or objects. Since these space tiles are presently empty, they are considered free space tiles eligible to receive additional objects or shapes.

The dimensions of the space tiles can be adjusted to allow compliance with design and manufacturing rules. Since one reason for identifying free space tiles is to identify regions of the chip that are available to locate additional objects (such as routing shapes), the dimensions of the space tiles may be adjusted to ensure that placing an object in the free space tile will not create a conflict, e.g., a design rule checking ("DRC") violation or a color-related spacing violation, with other existing objects on the layout.

Referring to FIG. 5B, shown is the window 502a containing the free space tiles 530, 532, 534, 536, 538, 540, 542, and 542 that were created surrounding object 504 and its corresponding used space tile 546 in FIG. 5A. Without taking design rules into account, each of the free space tiles 530-544 directly abut the used space tile 546, since the only consideration taken to this point to form the free space tiles has been to identify the exact exterior dimensions of the object 504. To comply with design rules, a fence can be created around object 504 that identifies a surrounding distance in which other objects cannot be placed. Thus, boundary lines 520, 522, 524, and 526 are shifted by a given clearance distance away from the edges of object 204, as shown in window 502b. As before, the boundary lines form the boundaries of the resultant space tiles in the window 502b. Thus, it can be seen that used space tile 546 now includes a fence around object 504 that is not actually occupied, but is considered "used" to prevent other objects from being placed within that region in a way that would violate design or manufacturing rules.

Figure 5C:
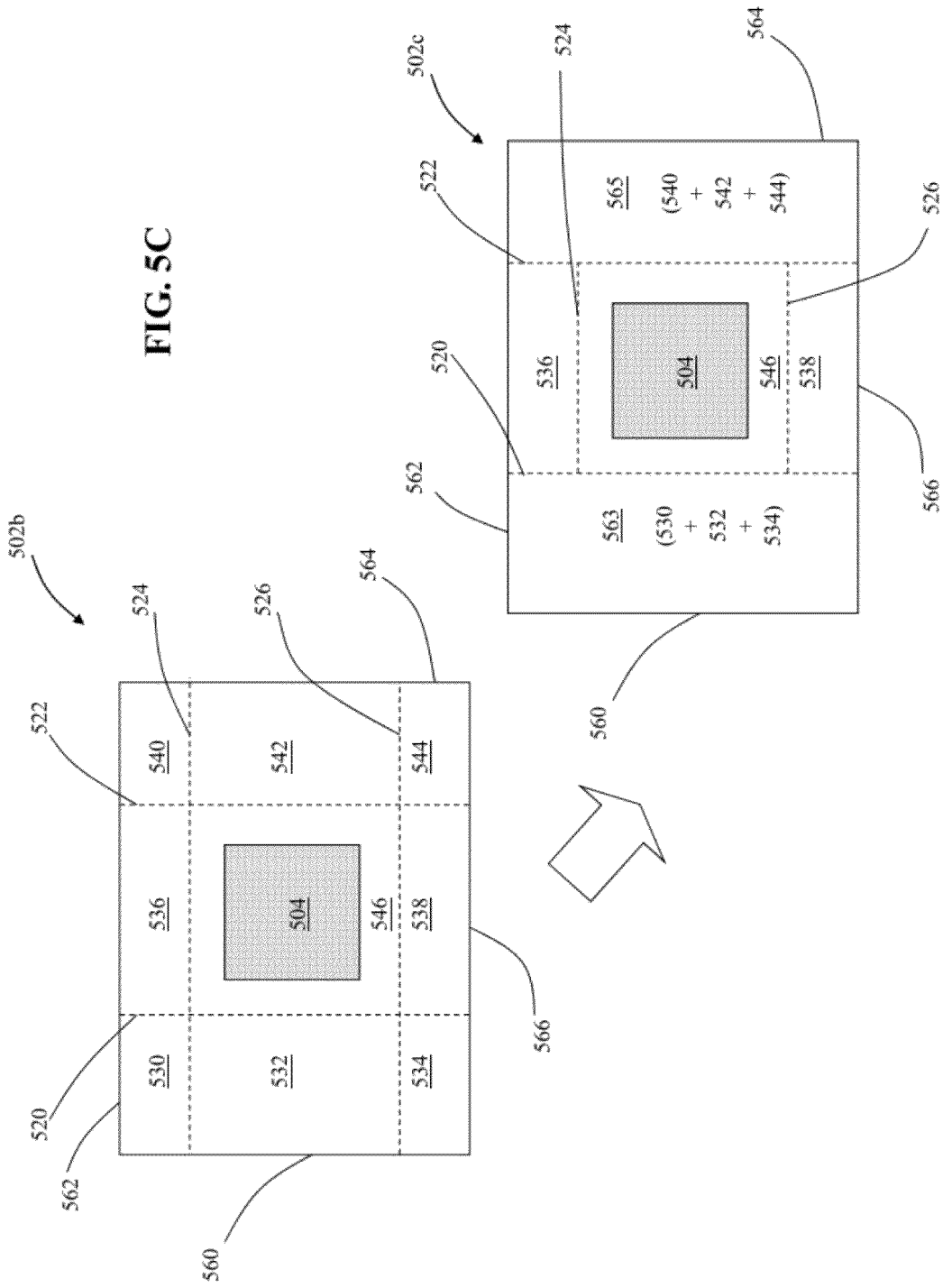

Once the free space tiles have been established, some or all of the free space tiles can be combined into larger free space tiles. Referring to FIG. 5C, it can be seen that free space tiles 530, 532, and 534 have been combined into a single large free space tile 563 along the left portion of the window 502c. Similarly, free space tiles 540, 542, and 544 have been combined into a single large free space tile 565 along the right portion of window 502b. Alternatively, these larger free spaces 563 and 565 are initially created when the free space tiles are identified, such that the breakup of space in the area of window 502 is not symmetric. This allows the tiles in one area (i.e., free space tiles 563 or 565) to extend all the way to the edges of the used space tile 546, but tiles in other areas do not, i.e., free space tiles 536 and 538. In one embodiment, this is considered "preferred vertical" fracturing that can be used on a layer with preferred vertical routing. In an embodiment, the preferred fracturing direction of each layer is controllable and optional.

The process of tessellating a chip portion or area into space tiles can also be referred to as space tile "punch." During the punch process, identification is made of all the shapes that affect the area and which affect the formation of space tiles. In one approach, punching a shape leaves a hole in the tile area where the shape being punched is located. Alternatively, the used space tiles can be left behind.

Figure 6A:
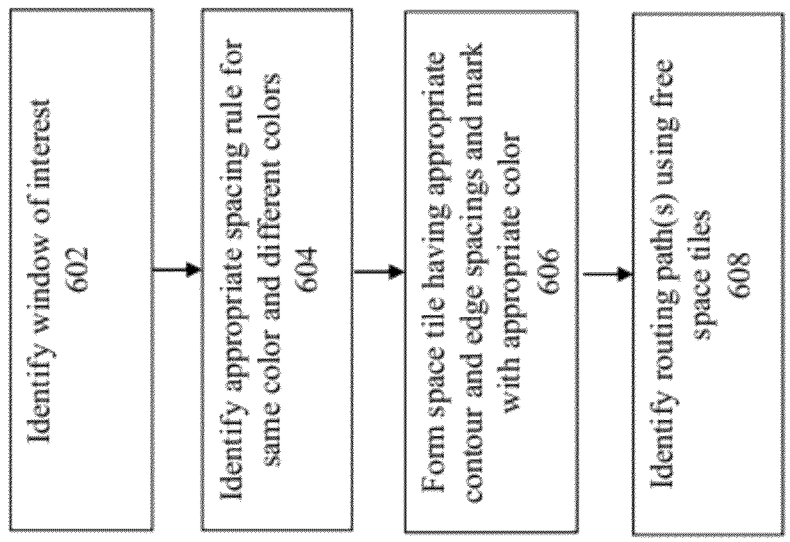
FIG. 6A shows a flowchart of an approach for identifying space tiles for performing double-pattern lithography.

FIG. 6A shows a flowchart of an embodiment of a process for identifying space tiles for double patterning, in which the edges of the free space tiles are configured such that they inherently mark legal routing paths for the centerline of a wire (in addition to anywhere within the area of the space tile also corresponding to legal routing path locations). In this approach, if the contour of the free space tile is configured based upon the shape of a blockage and minimum R-R/B-B and R-B/B-R spacing rules are applied, then routing paths defined by the outline of the free space tiles closest to a blockage essentially provides the closest legal path that can be taken to the blockage for the R-R/B-B and R-B/B-R routes.

At 602, identification is made of the window of interest in which it is desired to locate a routing path. Because of the C-routing approach described above, color seeding has already taken place to place colors for shapes within the layout. Therefore, blockages within the layout window are already associated with an R or B color.

At 604, the appropriate spacing rule(s) are identified for the edge of the free space tiles to be formed in the window. For R-R and B-B, the edge of the space tile is configured to form a minimum fence around blockages comprising half the width of the contemplated wire plus the appropriate clearance distance to avoid R-R/B-B design rule violations. For R-B and B-R, the edge of the space tile is configured to form a minimum fence around blockages comprising half the width of the contemplated wire plus the appropriate clearance distance to avoid R-B/B-R design rule violations.

At 606, free space tiles are formed having appropriate contours and edge spacing related to one or more blockages. The space tile areas would be marked with the appropriate color corresponding to the blockage of interest. For example, a B blockage would have a space tile area marked R with boundaries formed of ½ the wire width plus the B-R spacing rule distance. The same B blockage would have another space tile area marked B with boundaries formed of ½ the wire width plus the B-B spacing rule distance. Because the spacing rules have been applied, the outline of the R and B free space tiles adjacent to the blockage are now guaranteed to provide a legal routing path for the centerline of a wire having the contemplated wire width for the R and B wires, respectively.

It is noted that the space tile area marked with the same color is usually larger than the space tile area marked with the opposite color. Therefore, the space tile area marked with the same color can also be considered to have "any" color, since this space tile can be used to implement routing paths of either color. Therefore, an area that is illegal for blue wires is labeled as "red", an area that is illegal for red wires is labeled as "blue", and an area that has no requirement can be labeled as "any".

At 608, one or more routing paths can now be identified along the edges of the free space tiles. The B colored space tile would inherently provide legal routing paths for a B colored wire and the R colored space tile would inherently provide legal routing paths for R colored wires.

Therefore, the invention uses space-tile markings to understand what regions are allowed for each color, where the space-tile represents a region where the centerline of a wire is allowed to go, or the origin of a via is allowed to go. This assumes that there is a same-color clearance and a different-color clearance, where the different-color clearance is the minimum spacing value. The same-color clearance is expected to be larger than the minimum spacing.

To illustrate, consider the B shape shown in FIG. 6B. The region within the minimum spacing+½ wire width from the blue shape is a place where no wire centerline can be placed. The space tile region from Distance 1 to Distance 2 (within same-color spacing+½ wire width) is the area where the centerline of only an R wire can be routed. The area outside of Distance 2 is where the centerline of either a red wire or a blue wire can be routed.

The proposed solution is to use space-tile markings to understand what regions are allowed for each color. A "free" space-tile represents a region where the centerline of a wire is allowed to go, or the origin of a via is allowed to go. Assume that there is a same-color clearance and a different-color clearance. The different-color clearance is the minimum spacing value. The same-color clearance is expected to be larger than min spacing. Consider a blue shape. The region that is (min spacing+½ wire width) from the blue shape is a place where the centerline of a red wire can go. However, the region that is (same-color clearance+½ wire width) from the blue shape is a place where either a red or a blue wire can go. The invention therefore labels the space-tiles as blocked (no wire can go there), okay for red, okay for blue or okay for either red or blue (any color). Using these space-tile marks, the search strategy can be modified to implement routing.

A 'probe' is a subdivision of a space-tile where a wire can be placed. If a probe enters a blocked space-tile, the probe dies. If a probe enters a red-only space-tile, the probe must be red, and its descendants (until a layer change) must be red. These descendent red probes must remain in the space-tiles marked as red only or 'any'. A colored probe may not enter an opposite-color space-tile. An uncolored probe may enter any space-tile. See the attached document for further details.

Figure 7:
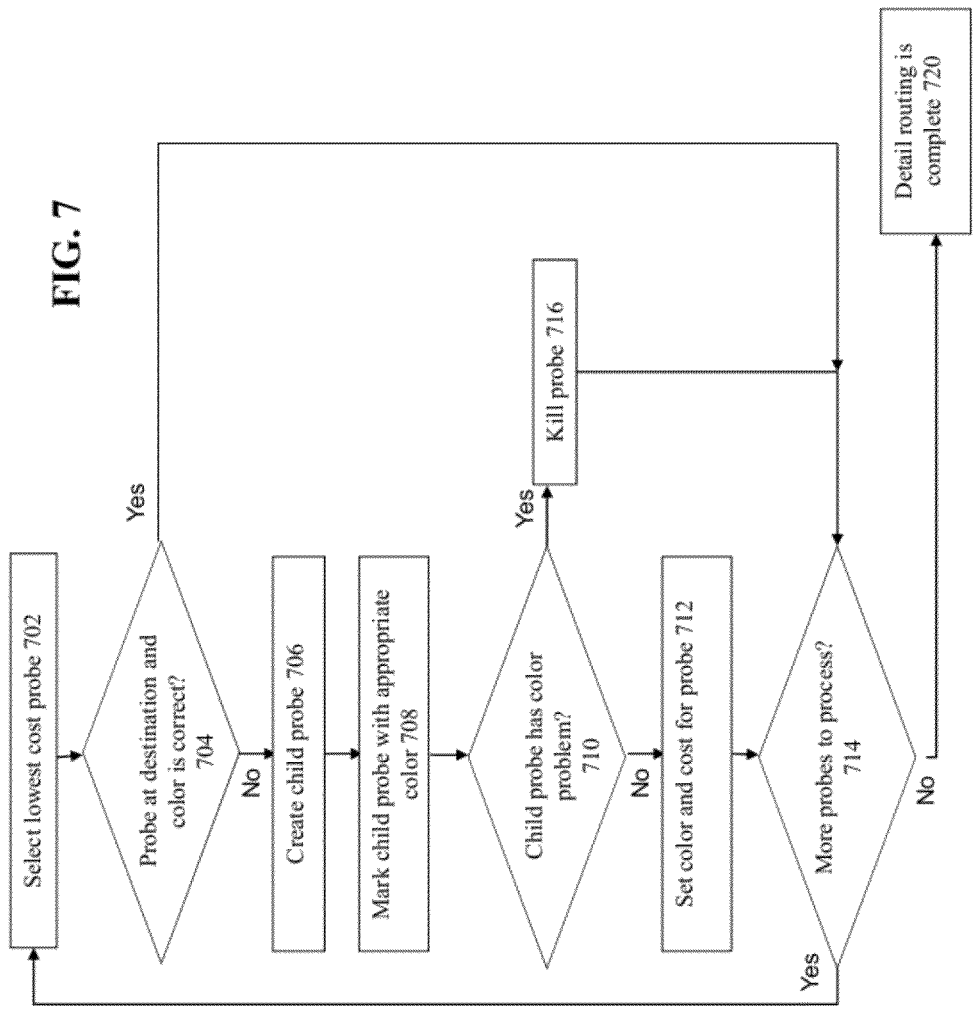
FIG. 7 shows a flowchart of an approach for implementing a search strategy for a detail router for performing double-pattern lithography.

FIG. 7 shows a flowchart of an embodiment of a search strategy that utilizes space tiles as described above. At 702, a lowest cost "probe" is selected from a group of probes waiting to be processed. A probe is a subdivision of a space-tile where the centerline of a wire or the origin of a via can be placed. Probes are identified as possible routing paths to a destination, and are placed in waiting area (e.g., a heap) to be processed. Probes can be associated with a cost corresponding to factors/heuristics that are associated with the cost of the routing path that would be created using that probe. The probes waiting to be processed can be sorted by the cost values, such that relatively lower costs probes are processed at 702 earlier than relatively more expensive probes.

A probe may be labeled as "red", "blue", or "any". A "planar probe" corresponds to a wire, and a "via probe" corresponds to a via. Probes that intersect an input endpoint terminus are called seed probes. A seed probe inherits the color of its corresponding shape. A child probe is constructed by intersecting a probe with its neighboring space-tiles, both in the plane and for vias. A child probe initially inherits its color from the space-tile that contains it. A via probe will inherit one color on its "from" side a possibly another color on its "to" side.

A determination is made at 704 whether the selected probe has reached its intended destination and whether the color is "any" or the same as the destination. If so, then the processing of the probe is at an end, and processing proceeds to 714 to check for whether there are additional probes to process. Step 704 assumes that a probe must be the same color as the destination, and that an R colored probe cannot be routed to a B colored destination (or vice versa). This is because in some fabrication facilities, stitching between shapes having different colors is not permitted.

In an alternate embodiment, stitching between different colors is permitted, with an appropriate cost factor being placed upon the stitching to influence whether or not such stitching will be implemented for any particular routing path. In this alternate approach, step 704 only checks for whether or not the probe reaches the intended destination, with the issue of color matching being left to cost analysis to determine if a probe/route having same colors is more cost effective than probes/routes that have different colors. If not, then the probe having a different color from the destination with a lower cost may be preferentially selected over the probe having the same color as the destination but having a higher cost. This cost-based approach can be used to implement step 704 that only allows probes that match the color of the destination by setting the cost of mismatched colors to an infinite value.

If at 704 it is determined that the probe does not reach its destination and/or does not have the correct color match with the destination, then at 706 a new child probe is created. The child probe is created by intersecting the probe with a neighboring space-tile. At 708, the child probe is initially marked with the space-tile color. It is possible that the "from" and "to" sides of a via probe have different colors.

A determination is made at 710 whether the color of the child probe presents a problem. If a child planar probe is inconsistent with its parent (one has red, and the other blue), the child probe is killed at 716, meaning that it is not considered further. A child via probe is killed if the "from" side has a different color than its parent.

If the probe has a color and the planar child probe is "any", the planar child probe's color is set to match the parent's color at 712. The child via probe will take the color of its "to" side. The surviving child probes are scored and placed on the heap for further consideration. Assuming that there are more probes to process, then processing returns back to 702 to select another probe for process.

If the search terminates successfully, a coloring is possible and may be defined by the probe colors. Any connected portion on the same layer must be given the same color. By construction, all probes on the same layer have consistent coloring. If the probes on the same layer are "any", then some other mechanism can be used to color the resulting wires and vias. This may be done with a coin flip or by a localized analysis of the colors in an area, or by some other mechanism.

Figure 8F:
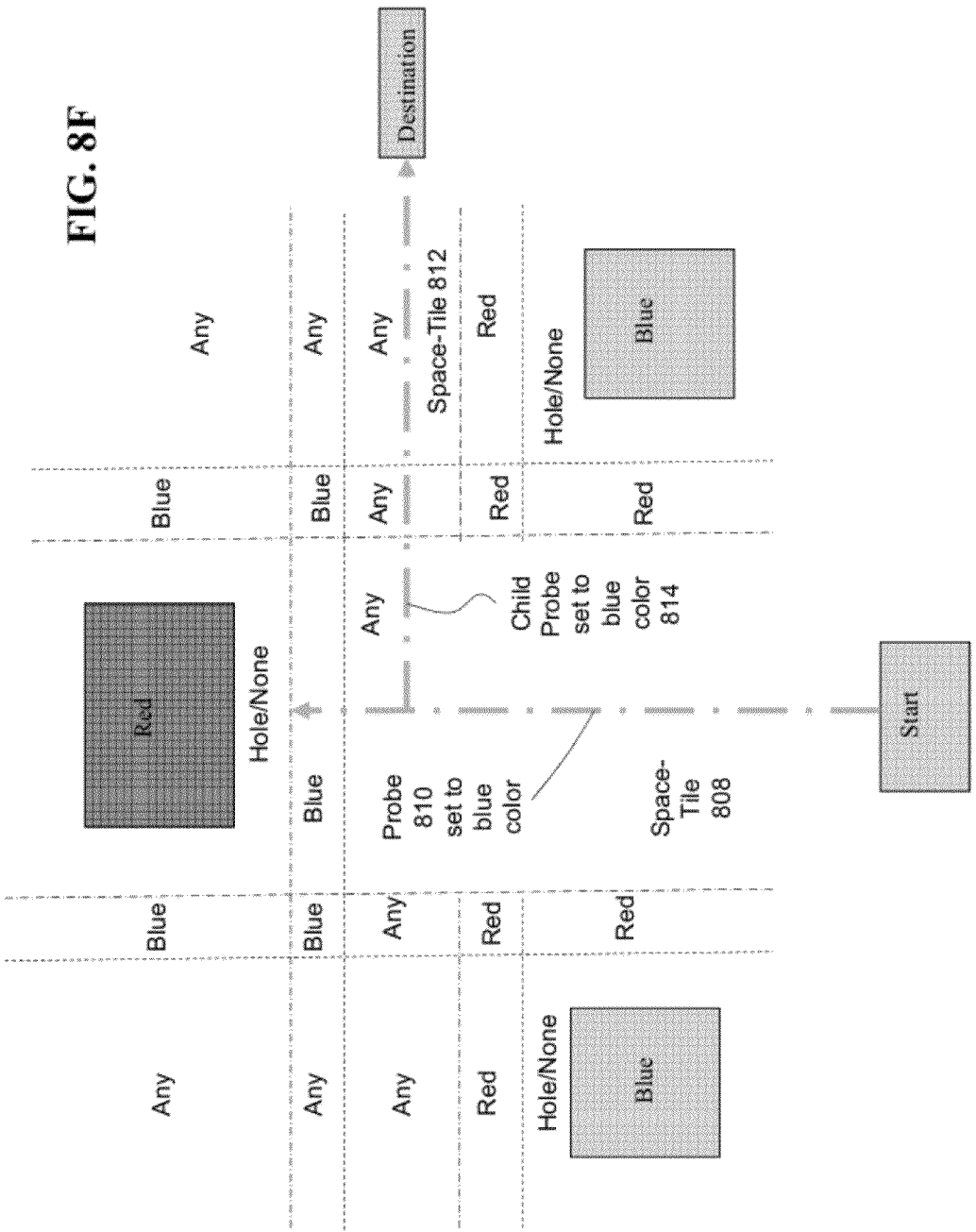

FIGS. 8A-F provide a simple illustrated example of this search strategy. FIG. 8A shows an example color-seeded layout which include a single red blockage and two blue blockages. Also shown is the starting point and a destination point for a wiring path that needs to be routed. Assume in this example that the start and destination points/pins correspond to the blue color.

The first action is to identify the color-based space tiles within this layout portion. FIG. 8B illustrates some example space tiles that are formed based upon the edges of the existing red and blue blockages. Each blockage corresponds to contour lines that define the boundaries for the space tiles, where each space-tile is marked with a "red", "blue", or "any" label that correspond to an identification of the appropriate "red", "blue", and/or "any" colored shapes that may be placed into that space-tile. The portions marked "Hole/None" indicates that no shapes are permitted in those portions. In this example it can be seen that multiple space tiles can be identified in the layout portion, including space tiles 808 and 812, with each of these space-tiles potentially having different color labels for different colored wires to be routed through that space tile.

FIG. 8C shows a seed probe 810 that extends in the "north" direction from the starting point/pin. The probe extends through the space-tile 808. While probe 810 is illustrated as a line in this figure, it is understood that the probe represents a subset of the space-tile which can correspond to any suitable shape. In this case, the seed probe 810 extends from a blue-colored starting location, and is therefore set to the same color as its originating point (blue) as shown in FIG. 8D.

At this point, a check is made whether probe 810 has reached the destination, and if so, whether there are any color problems. Here, it can be seen that the probe 810 has not reached the intended destination. Therefore, the search process will continue.

In particular, a child probe 814 will be created in space-tile 812 that extends in the "east" direction from parent probe 810, as shown in FIG. 8E. AT this point, the space-tile can be colored as "any", so child probe 814 can also be set to the "any" color.

At this point, another check is made whether the probe of interest (child probe 814) has reached the destination, and if so, whether there are any color problems. Here, it can be seen that the child probe 814 has indeed reached the intended destination. In addition, the color of the child probe 814 (any) can be set to match the color of the destination point (blue). Therefore, the color of the child probe 814 is set to the blue color to match the color of the destination point. At this point, the search process will now end.

Assume for the moment that planar probes cannot solely be used to route a wiring path between a starting point and a destination point because of a color mismatch (e.g., if the destination point is blue and starting point is red in FIG. 8A). In this situation, via probes would be employed to allow the routing path to extend to another layer to resolve the color mismatch.

Therefore, what has been described is an improved approach for implementing routing for double patterning lithography. This technique is very advantageous since it is designed for space-based routing, and does not require a grid in order to perform routing. Therefore, the present approach can handle extensions and modifications to the double-patterning requirements and can generate detail routes that are correct-by-construction.

System Architecture

Figure 9:
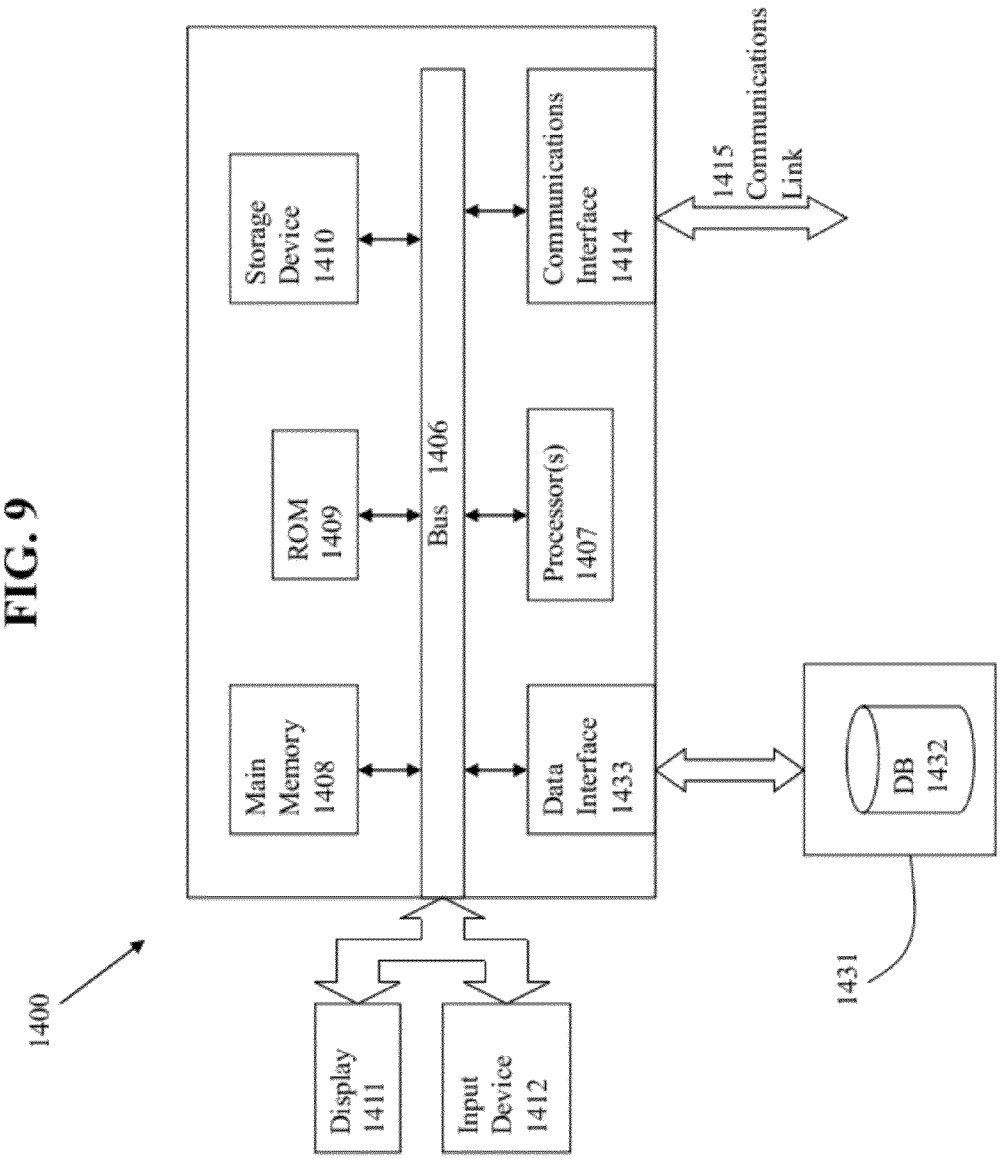
FIG. 9 is a block diagram of a computing system suitable for implementing an embodiment of the present invention.

FIG. 9 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the inven-

What is claimed is:

1. A computer implemented method for implementing space-tiles to perform routing of an electronic circuit design, the method implemented with a processor, the method comprising:
   identifying a window of interest in a layout;
   identifying spacing rules for same color and different color shapes, in which colors for layout objects comprise a first color and a second color, where the first color corresponds to a first manufacturing pattern mask and the second color corresponds to a second manufacturing pattern mask;
   forming a space tile having a space-tile contour corresponding to a blockage contour, the space tile having a boundary that is established using the spacing rules; and
   associating the space-tile with a selected color, where the space tile defines legal routing paths the layouts objects for associated with the selected color in the window of interest; wherein at least one of the previous steps is performed using a computer.

2. The method of claim 1 in which the selected color comprises the first color, the second color, or an any color that may correspond to either the first or second color.

3. The method of claim 1 in which the spacing rules for the same color corresponds to ½ expected wire width plus a spacing rule distance for objects having the same color.

4. The of claim 1 in which the spacing rules for the different colors corresponds to ½ expected wire width plus a spacing rule distance for objects having different colors.

5. The method of claim 1 in which the spacing rules comprise width-dependent spacing rules.

6. The method of claim 1 in which an edge of the space-tile corresponds to a legal location to route a centerline of a wire of an appropriate color.

7. The method of claim 1 in which an interior area of the space tile corresponds to a legal location to route wires of an appropriate color.

8. The method of claim 1 in which spacing rules distances for the same color are larger than spacing rule distances for different colors.

9. A computer program product embodied on a non-transitory computer readable medium, the non-transitory computer readable medium having stored thereon a sequence of instructions which, when executed by a processor causes the processor to execute a method for implementing space-tiles to perform routing of an electronic circuit design, the method comprising:
   identifying a window of interest in a layout;
   identifying spacing rules for same color and different color shapes, in which colors for layout objects comprise a first color and a second color, where the first color corresponds to a first manufacturing pattern mask and the second color corresponds to a second manufacturing pattern mask;
   forming a space tile having a space-tile contour corresponding to a blockage contour, the space tile having a boundary that is established using the spacing rules; and
   associating the space-tile with a selected color, where the space tile defines legal routing paths for the layout objects associated with the selected color.

10. The computer program product of claim 9 in which the selected color comprises the first color, the second color, or an any color that may correspond to either the first or second color.

11. The computer program product of claim 9 in which the spacing rules for the same color corresponds to ½ expected wire width plus a spacing rule distance for objects having the same color.

12. The of computer program product 9 in which the spacing rules for the different colors corresponds to ½ expected wire width plus a spacing rule distance for objects having different colors.

13. The computer program product of claim 9 in which the spacing rules comprise width-dependent spacing rules.

14. The computer program product of claim 9 in which an edge of the space-tile corresponds to a legal location to route a centerline of a wire of an appropriate color.

15. The computer program product of claim 9 in which an interior area of the space tile corresponds to a legal location to route wires of an appropriate color.

16. The computer program product of claim 9 in which spacing rules distances for the same color are larger than spacing rule distances for different colors.

17. A system for implementing space-tiles to perform routing of an electronic circuit design, comprising:
   a processor;
   a memory for holding programmable code; and
   wherein the programmable code includes instructions for identifying spacing rules for same color and different color shapes, in which colors for layout objects comprise a first color and a second color, where the first color corresponds to a first manufacturing pattern mask and the second color corresponds to a second manufacturing pattern mask, forming a space tile having a space-tile contour corresponding to a blockage contour, the space tile having a boundary that is established using the spacing rules, and associating the space-tile with a selected color, where the space tile defines legal routing paths the layout objects for associated with the selected color.

18. The system of claim 17 in which the selected color comprises the first color, the second color, or an any color that may correspond to either the first or second color.

19. The system of claim 17 in which the spacing rules for the same color corresponds to ½ expected wire width plus a spacing rule distance for objects having the same color.

20. The system of claim 17 in which the spacing rules for the different colors corresponds to ½ expected wire width plus a spacing rule distance for objects having different colors.

21. The system of claim 17 in which the spacing rules comprise width-dependent spacing rules.

22. The system of claim 17 in which an edge of the space-tile corresponds to a legal location to route a centerline of a wire of an appropriate color.

23. The system of claim 17 in which an interior area of the space tile corresponds to a legal location to route wires of an appropriate color.

24. The system of claim 17 in which spacing rules distances for the same color are larger than spacing rule distances for different colors.

* * * * *